US009633875B2

(12) United States Patent
Sun et al.

(10) Patent No.: US 9,633,875 B2
(45) Date of Patent: Apr. 25, 2017

(54) APPARATUS FOR IMPROVING TEMPERATURE UNIFORMITY OF A WORKPIECE

(71) Applicant: Varian Semiconductor Equipment Associates, Inc., Gloucester, MA (US)

(72) Inventors: Dawei Sun, Lynnfield, MA (US); D. Jeffrey Lischer, Acton, MA (US); Steven M. Anella, West Newbury, MA (US); Dale K. Stone, Lynnfield, MA (US); Lyudmila Stone, Lynnfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 90 days.

(21) Appl. No.: 14/657,193

(22) Filed: Mar. 13, 2015

(65) Prior Publication Data

US 2016/0268150 A1 Sep. 15, 2016

(51) Int. Cl.
*H05B 1/02* (2006.01)
*H01L 21/67* (2006.01)

(52) U.S. Cl.
CPC .............................. *H01L 21/67103* (2013.01)

(58) Field of Classification Search
CPC ............ H01L 21/67103; H05B 1/0233; H05B 3/0047; H05B 2203/005; H05B 1/02
USPC ......... 219/12.58, 121.43, 483, 486; 118/724, 118/725; 156/345.52, 345.27, 345.51
See application file for complete search history.

(56) References Cited

U.S. PATENT DOCUMENTS

| | | | |
|---|---|---|---|
| 5,695,568 A * | 12/1997 | Sinha | C23C 16/4412 118/500 |
| 6,342,691 B1 * | 1/2002 | Johnsgard | H01L 21/67115 118/50.1 |
| 7,244,336 B2 * | 7/2007 | Fischer | H01J 37/32642 118/723 E |
| 8,555,810 B2 * | 10/2013 | Park | H01J 37/32091 118/723 E |
| 2003/0080109 A1 | 5/2003 | Choi et al. | |
| 2011/0097681 A1 | 4/2011 | Lee | |

(Continued)

FOREIGN PATENT DOCUMENTS

KR 10-2010-0060688 A 6/2010
KR 10-2011-0130631 A 12/2011

OTHER PUBLICATIONS

International Search Report and Written Opinion mailed Jul. 20, 2016 in corresponding PCT application No. PCT/US2016/020253.

*Primary Examiner* — Mark Paschall
(74) *Attorney, Agent, or Firm* — Nields, Lemack & Frame, LLC (57) ABSTRACT

An apparatus for improving the temperature uniformity of a workpiece during processing is disclosed. The apparatus includes a platen having a separately controlled edge heater capable to independently heating the outer edge of the platen. In this way, additional heat may be supplied near the outer edge of the platen, helping to maintain a constant temperature across the entirety of the platen. This edge heater may be disposed on an outer surface of the platen, or may, in certain embodiments, be embedded in the platen. In certain embodiments, the edge heater and the primary heating element are disposed in two different planes, where the edge heater is disposed closer to the top surface of the platen than the primary heating element.

20 Claims, 7 Drawing Sheets

(56) References Cited

U.S. PATENT DOCUMENTS

2014/0193942 A1  7/2014 Woods et al.
2016/0181132 A1* 6/2016 Anella .................. H01L 21/324
                                                                    438/799

* cited by examiner

APPARATUS FOR IMPROVING TEMPERATURE UNIFORMITY OF A WORKPIECE

FIELD

Embodiments of the present disclosure relate to apparatus for improving the temperature uniformity of a workpiece during processing, and more particularly, improving the temperature uniformity of a heated workpiece.

BACKGROUND

The fabrication of a semiconductor device involves a plurality of discrete and complex processes. To perform these processes, a workpiece is typically disposed on a platen. The platen may be an electrostatic chuck, designed to retain the workpiece through the application of electrostatic forces produced by electrodes within the platen.

Platens are typically designed to be slightly smaller in diameter than the workpieces that they support. This insures that the platen is not exposed to the incoming ion beam. Contact with the ion beam could cause the generation of contaminants, or may do damage to the platen. Additionally, some platens have sloped or tapered side walls to minimize the possibility that the sidewall is exposed to the incoming ion beam.

In addition to retaining the workpiece in place, the platen may also serve to heat or cool the workpiece. Specifically, the platen is typically a larger mass of material, capable to drawing heat from the workpiece in some embodiments, or supplying heat to the workpiece in other embodiments. In certain embodiments, the platen has conduits on its upper surface which supply a back side gas to the space between the upper surface of the platen and the back surface of the workpiece.

Because the platen is somewhat smaller than the workpiece, the outer edge of the workpiece may not be heated or cooled as effectively by the platen. In fact, in some embodiments, the temperature near the outer edge may be 4-10% less than the rest of the workpiece. Further, the outer edge of the platen radiates more heat to the environment than the rest of the platen, which serves to lower the temperature of the platen at its outer edge. Thus, in embodiments where the platen supplies heat to the workpiece, the outer edge of the workpiece may be cooler than the rest of the workpiece. Conversely, in embodiments where the platen is removing heat from the workpiece, the outer edge of the workpiece may be hotter than the rest of the workpiece.

This difference in temperature may impact the yield of the workpiece. Additionally, these temperature gradients along the outer edge of the platen may exert thermal stress on the platen, which may lead to platen failure. Therefore, it would be beneficial if there were an apparatus to achieve better temperature uniformity across a workpiece, especially in embodiments where the workpiece is heated by the platen.

SUMMARY

An apparatus for improving the temperature uniformity of a workpiece during processing is disclosed. The apparatus includes a platen having a separately controlled edge heater capable to independently heating the outer edge of the platen. In this way, additional heat may be supplied near the outer edge of the platen, helping to maintain a constant temperature across the entirety of the platen. This edge heater may be disposed on an outer surface of the platen, or may, in certain embodiments, be embedded in the platen. In certain embodiments, the edge heater and the primary heating element are disposed in two different planes, where the edge heater is disposed closer to the top surface of the platen than the primary heating element.

According to a first embodiment, a workpiece holding and heating apparatus is disclosed. The workpiece holding and heating apparatus comprises a platen, wherein the platen comprises a top surface, a bottom surface, and a sidewall extending between the top surface and the bottom surface; a primary heating element disposed in a first plane; and an edge heater disposed in a second plane, where the second plane is closer to the top surface than the first plane. In certain embodiments, the edge heater may be embedded in the platen. In other embodiments, the edge heater is affixed to an exterior surface of the platen.

According to a second embodiment, a workpiece holding and heating apparatus is disclosed. The workpiece holding and heating apparatus comprises a platen, wherein the platen comprises a top surface, a bottom surface, and a sidewall extending between the top surface and the bottom surface, where the sidewall comprises a horizontal annular ring portion, parallel to the top surface; a primary heating element; and an edge heater disposed on the horizontal annular ring portion.

According to a third embodiment, a workpiece holding and heating apparatus is disclosed. The workpiece holding and heating apparatus comprises a platen, wherein the platen comprises a top surface, a bottom surface, and a tapered sidewall extending between the top surface and the bottom surface; a primary heating element; and an edge heater disposed parallel to the tapered sidewall. In certain embodiments, the edge heater is affixed to the tapered sidewall. In other embodiments, the edge heater is embedded in the platen.

BRIEF DESCRIPTION OF THE FIGURES

For a better understanding of the present disclosure, reference is made to the accompanying drawings, which are incorporated herein by reference and in which.

DETAILED DESCRIPTION

As described above, the edges of workpieces disposed on traditional platens may overhang the platen, causing these edges to maintain a different temperature than the rest of the workpiece. Furthermore, since the outer edge of the platen is exposed to the environment, the outer edge tends to radiate more heat into the environment, effectively lowering the temperature along the outer edge of the platen. In other words, the heat generated in the interior of the platen is more likely to remain in the platen, while heat generated near the outer edge is more likely to dissipate into the environment.

One approach to address this issue is to provide a separately controlled edge heater near the outer edge of the platen. This edge heater may be used to compensate for the heat that is known to be lost near the outer edge of the platen. In certain embodiments, the edge heater is disposed closer to the workpiece than the primary heating element in the platen.

Figure 1:
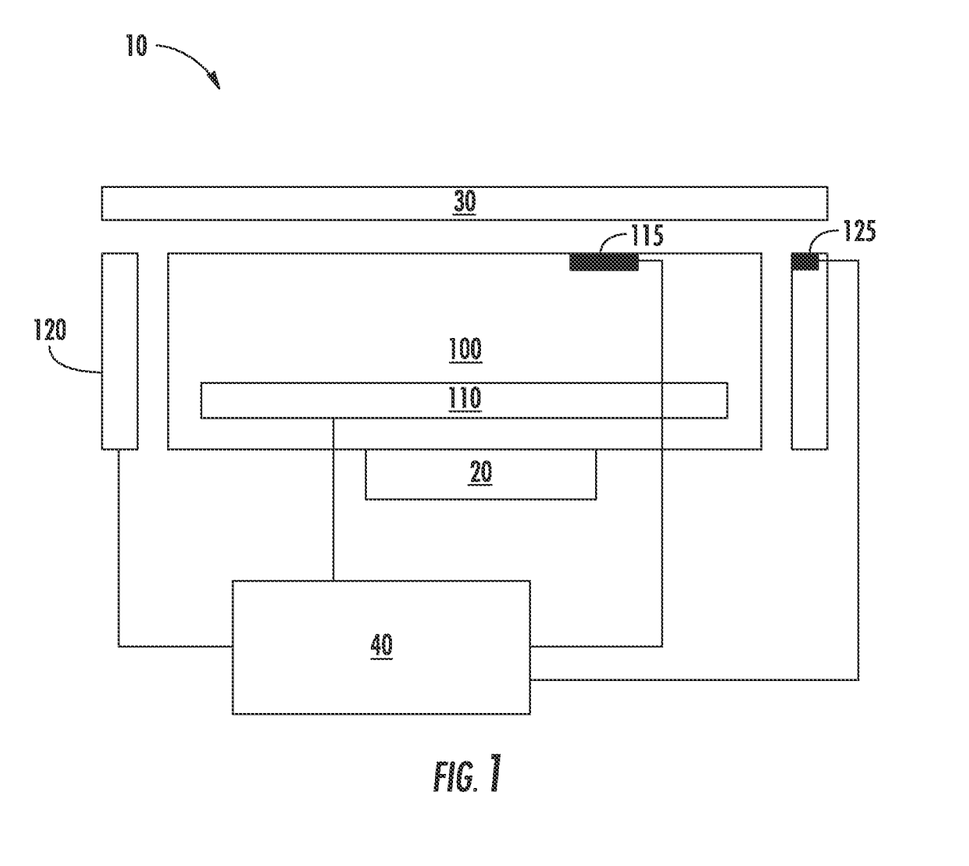
FIG. 1 is a block diagram of the system having a platen with an edge heater according to one embodiment.

FIG. 1 shows a representative illustration showing the components of the system 10. The platen 100 may be an electrostatic chuck (ESC), or any other type of platen. In some embodiments, the platen 100 comprises a plurality of conduits terminating on the upper surface of the platen 100, which deliver back side gas to the volume between the upper surface of the platen 100 and the bottom surface of the workpiece 30. The platen 100 may also have an outer seal ring (not shown) near its outer edge, which serves to confine the back side gas in this volume and minimize back side gas leakage. The outer seal ring extends upward from the upper surface of the platen 100 and contacts the workpiece 30, forming a wall that contains the back side gas. This outer seal ring may be effective because the outer seal ring contacts the workpiece 30. Further, the platen 100 may include an upper dielectric layer, under which a plurality of electrodes is disposed. Alternating voltage waveforms are applied to these electrodes, which create an electrostatic force that holds the workpiece 30 in place. This upper dielectric layer may be unable to withstand ion beam strike. Thus, because of the outer seal ring and the upper dielectric layer, the platen 100 is typically smaller than the workpiece 30 that is disposed thereon, to insure that the ion beam cannot strike the platen 100. In some embodiments, the workpiece 30 may overhang the platen 100 by 2-3 mm, although other dimensions are also possible and within the scope of the disclosure.

The platen 100 may be disposed on a base 20, used to support the platen 100. The base 20 may be made of the different material than the platen 100. Further, the temperature of the platen 100 may be uneven or non-uniform, as the outer surfaces that are exposed to the environment, and particularly the sidewalls of the platen 100, tend to radiate heat into the environment, lowering the temperature at these outer surfaces.

The platen 100 may have a cylindrical shape so as to support a disk-shaped workpiece. The outer edge of the platen 100 may be considered the portion of the platen 100 nearest the outer diameter of the platen 100. For example, an annular ring of several millimeters having an outer diameter that is the circumference of the platen 100 may be considered to be the outer edge. This outer edge may have a temperature different than the rest of the platen 100.

As shown in FIG. 1, the platen 100 may have a primary heating element 110, used to heat the platen 100. This primary heating element 110 may be disposed in the platen 100, as shown in FIG. 1, or may be disposed on an outer surface of the platen 100, such as the bottom surface of the platen 100. This primary heating element 110 may be a film comprising an electrically resistive material, so that the flow of current through the primary heating element 110 causes the generation of heat through the resistive material. The temperature of the platen 100 may be controlled by regulating the amount of current passing through the primary heating element 110. In certain embodiments, a controller 40 may be used to regulate the temperature of the platen 100 by controlling the flow of current through the primary heating element 110.

The platen 100 may also include a first temperature sensor 115, which is used to monitor the temperature of the platen 100. The controller 40 may regulate the temperature of the platen 100 by monitoring the temperature of the platen 100 using the first temperature sensor 115 and adjusting the current through the primary heating element 110 based on the monitored temperature. Thus, the first temperature sensor 115, the primary heating element 110 and the controller 40 form a first control loop to monitor and control the temperature of the platen 100.

The system 10 also comprises an edge heater 120, which is disposed near the outer edge of the platen 100. While FIG. 1 shows the edge heater 120 as being separate from the platen 100, it is understood that the edge heater 120 may be disposed on a surface of the platen 100 in certain embodiments. In other embodiments, the edge heater 120 may be disposed within the platen 100. The edge heater 120 may be a thin film material having an electrically resistive material. The use of thin film may allow the edge heater 120 to be more readily applied to various surfaces, as will be described in more detail below. In certain embodiments, the thin film may be about 0.01 mm in thickness, although other thicknesses are also possible. A current is then passed through the electrically resistive material to generate heat. The thickness or/and width of the thin film material may be varied to control the amount of heat generated in the film to affect temperature uniformity.

A second temperature sensor 125 may be disposed near the outer edge of the platen 100 so as to measure the temperature at the outer edge. As explained above, the outer edge of the platen 100 may be cooler than the rest of the platen 100 due to the radiation of heat to the environment. While the second temperature sensor 125 is shown mounted on the edge heater 120, other embodiments are possible. In certain embodiments, the second temperature sensor 125 is disposed on the platen 100, near its outer edge, separate from the edge heater 120. This second temperature sensor 125, the edge heater 120 and the controller 40 may form a second control loop used to monitor and control the temperature of the platen 100 at its outer edge. This second control loop may operate independent of the first control loop.

The controller 40 may be any suitable device, which is capable of receiving inputs from one or more sources, such as the first temperature sensor 115 and the second temperature sensor 125. The controller 40 is also capable of providing outputs, such as current control to the primary heating element 110 and the edge heater 120.

Having defined the general architecture of the system 10, various embodiments will be described. It should be noted that these embodiments are only illustrative and the disclosure is not limited to those embodiments presented.

Figure 2A:
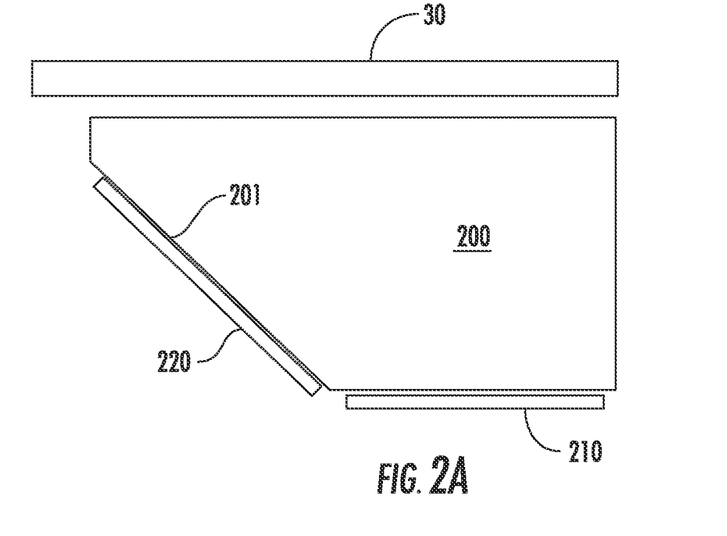
FIGS. 2A-2B are side views of platens with an edge heater affixed to a tapered sidewall according to one embodiment.

FIG. 2A shows a first embodiment of a platen 200 having an edge heater 220. FIG. 2A shows a side view of the platen 200, which may have a sidewall 201, which may be sloped or tapered. In other words, the sidewall 201 of the platen 200 may form an acute angle, such as 45° with the top surface of the platen 200. The angle that the sidewall 201 forms with the top surface is an implementation decision and is not limited by the present disclosure. The use of a tapered sidewall may reduce the amount of sputtering caused by the ion beam striking the sidewall 201.

In this particular embodiment, the primary heating element 210 may be disposed on the bottom of the platen 200. As such, the primary heating element 210 may be about 8-10 mm away from the top surface of the platen 200. Since the sidewall 201 is tapered, the primary heating element 210 does not extend to the outermost portions of the top surface. Therefore, due to the location at which the heat is generated and the losses incurred at the sidewalls, the outer edge of the platen 200 may be at a lower temperature than the rest of the platen 200.

Figure 2B:
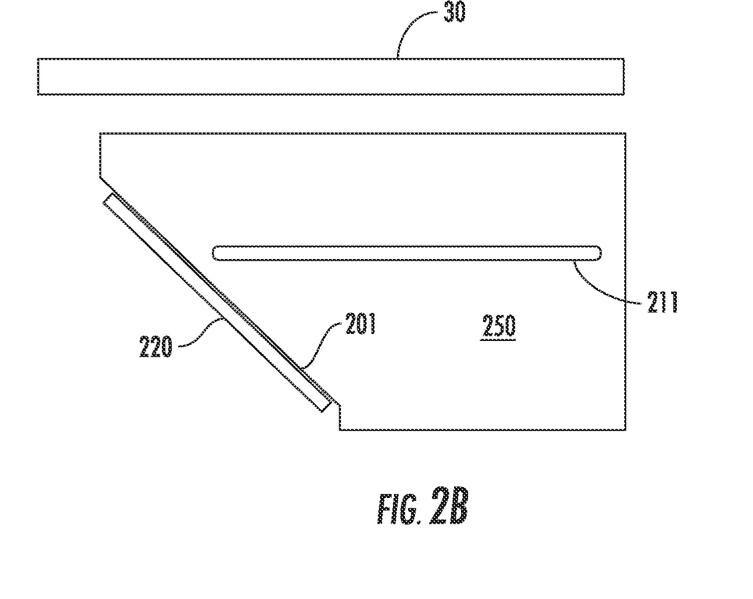

FIG. 2B shows a variation of FIG. 2A, where the primary heating element 211 is disposed within or is embedded in the platen 250. This may be achieved by manufacturing the platen 250 as two portions. For example, the platen 250 may comprise a ceramic material. The primary heating element 211 may then be placed between the two horizontal ceramic portions. The wires used to connect to the primary heating element 210 may extend through the outside of the platen 250. The assembly, which includes the two ceramic portions with the primary heating element 211 interposed therebetween, may then be fired, encapsulating the primary heating element 211 in the platen 250. In yet another embodiment, there may be multiple primary heating elements 211 disposed within the platen 250. In this embodiment, the primary heating element 211 may be disposed about 1-5 mm from the top surface of the platen 250.

Like the platen 200 of FIG. 2A, the platen 250 may have a sidewall 201 that is tapered. Again, because of the taper of the sidewall 201, the primary heating element 211 does not extend to the outer diameter of the top surface of the platen 250.

In certain embodiments, the embodiments of FIGS. 2A and 2B may be combined, such that there is a primary heating element 210 disposed on the bottom surface of the platen and at least one primary heating element 211 embedded in the platen. In other words, the placement and number of primary heating elements 210, 211 are not limited by the disclosure.

In each of these embodiments, the edge heater 220 is disposed on the sidewall 201. The edge heater 220 may be a thin film, as described above, which is affixed to the sidewall 201. Since the sidewall 201 is tapered, the edge heater 220 may be frustoconical in shape to match the shape of the sidewall 201. In certain embodiments, the edge heater 220 may be affixed to the sidewall 201, such as by using an adhesive. To reduce the possibility that the edge heater 220 is exposed to the ion beam, a protective coating may be disposed over the edge heater 220. For example, a glass layer may be used to cover the thin film that forms the edge heater 220. Of course, other materials may be used to cover the edge heater 220.

The placement of the edge heater 220 along the sidewall 201 serves several purposes. As described above, the heat in the platen radiates from those surfaces exposed to the environment. Consequently, the sidewall 201 is a source of heat loss. By disposing the edge heater 220 on the sidewall 201, the edge heater 220 may be used to counteract the losses that are attributed to the sidewall 201. This may help insure that the temperature across the entirety of the platen is more uniform.

Figure 3A:
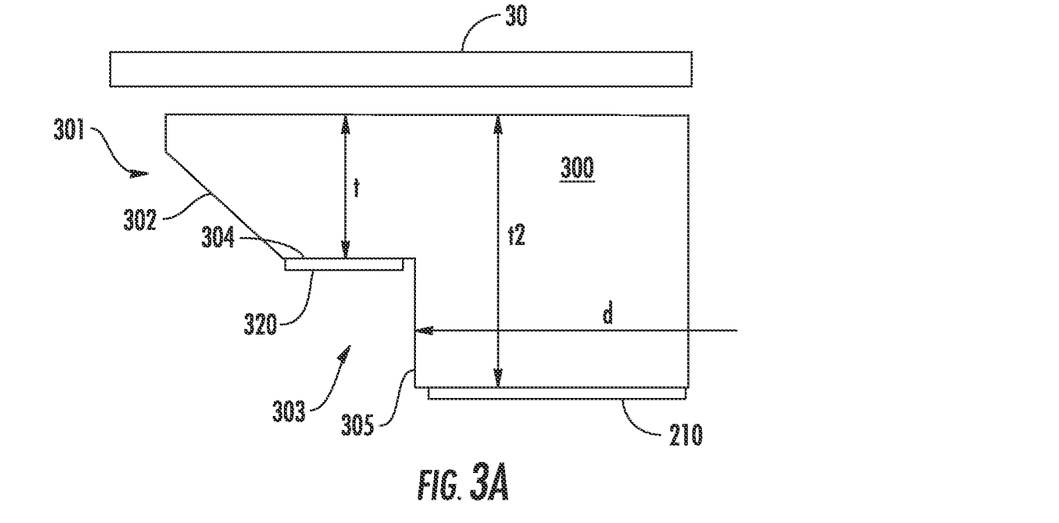
FIGS. 3A-3B are side views of platens with an edge heater according to another embodiment.
Figure 3B:
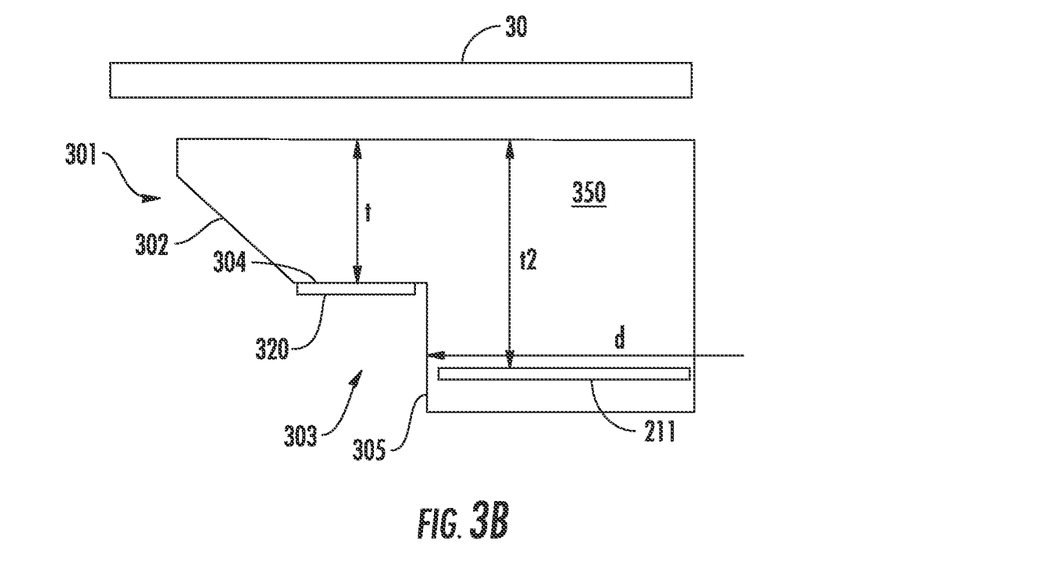

FIGS. 3A-3B shows another embodiment using an edge heater 320, which may be flat. In the embodiment of FIG. 3A, the sidewall 301 of the platen 300 has a tapered portion 302, similar to that shown in FIGS. 2A-2B. As before, the tapered portion 302 may form an acute angle with the top surface of the platen 300, such as about 45°. However, in this embodiment, the sidewall 301 also has a notch 303. This notch 303 creates a horizontal portion of the sidewall 301, which is parallel to the top surface of the platen 300. This horizontal portion extends around the entirety of the platen 300 and thus forms a horizontal annular ring portion 304. A vertical portion 305 is also created by the notch 303. In certain embodiments, the vertical portion 305 may not be perfectly vertical. Rather, the vertical portion 305 is simply the surface that joins the horizontal annular ring portion 304 to the bottom surface of the platen 300.

As shown in FIG. 3A, the horizontal annular ring portion 304 is a distance "t" from the top surface of the platen 300. This distance "t" may be less than the distance "t2" from the primary heating element 210 to the top surface of the platen 300. In some embodiments, the distance "t" may be 2-3 mm although other distances are also possible. In contrast, the distance "t2" may be 8-10 mm.

The distance "d" represents the inner diameter of the horizontal annular ring portion 304. In certain embodiments, the inner diameter of the horizontal annular ring portion 304 may be about 280 mm, while the diameter of the platen 300 may be about 294 mm. The outer diameter of the horizontal annular ring portion 304 may be about 284-290 mm. Thus, the horizontal annular ring portion 304 may have a width of about 3-4 mm.

The creation of a horizontal annular ring portion 304 around the platen 300 allows the edge heater 320 to be a flat ring, as opposed to the frustoconical shape of FIGS. 2A-2B. This flat ring may be advantageous from a manufacturing, cost and assembly perspective. Further, the use of a horizontal annular ring portion 304 also creates a surface, which is parallel to the top surface of the platen 300, on which the edge heater 320 may be disposed.

As stated above, the edge heater 320 may be a flat ring, comprising a thin film. As described above, the edge heater 320 may be covered with a protective coating, such as a glass layer to protect the edge heater 320 from the ion beam. The edge heater 320 may be affixed to the horizontal annular ring portion 304, using an adhesive. In other embodiments, the edge heater 320 may be bonded to the horizontal annular ring portion 304 by heat or other means.

Since the edge heater 320 is closer to the top surface of the platen 300 than the primary heating element 210, the edge heater 320 may be able to provide more focused heat to the outer edge of the platen 300 and the workpiece 30. Additionally, the heat generated by the edge heater 320 is independent of the heat generated by the primary heating element 210. Therefore, it is possible to achieve a more uniform temperature profile across the top surface of the platen 300.

FIG. 3B shows another embodiment of a platen 350 having a horizontal annular ring portion 304. Like FIG. 3A, this embodiment comprises a sidewall 301 having a tapered portion 302, a horizontal annular ring portion 304, and a vertical portion 305, where the edge heater 320 is disposed on the horizontal annular ring portion 304. This embodiment differs from FIG. 3A in that the primary heating element 211 is embedded in the platen 350. The primary heating element 211 may be embedded using the technique described with respect to FIG. 2B. In this embodiment, the distance from the primary heating element 211 to the top surface of the platen 300, labeled "t2" may be 2-8 mm, while the distance from the edge heater 320 to the top surface of the platen 300, labeled "t", may be 1-7 mm. In certain embodiments, the primary heating element 211 may be 1 mm above the bottom surface, while the edge heater 320 is disposed at a position closer to the top surface.

The embodiments of FIG. 3A-3B modify the shape of the platen to create a horizontal annular ring portion 304 on the underside of the platen. This horizontal annular ring portion 304 may be parallel to the top surface. In both embodiments, the sidewall 301 of the platen may include a tapered portion 302 that extends from the top surface to the horizontal annular ring portion 304, the horizontal annular ring portion 304, and a vertical portion 305 that extends from the horizontal annular ring portion 304 to the bottom surface of the platen. As stated above, the vertical portion 305 may not be vertical, but rather is simply the surface that extends between the horizontal annular ring portion 304 and the bottom surface of the platen.

Figure 4A:
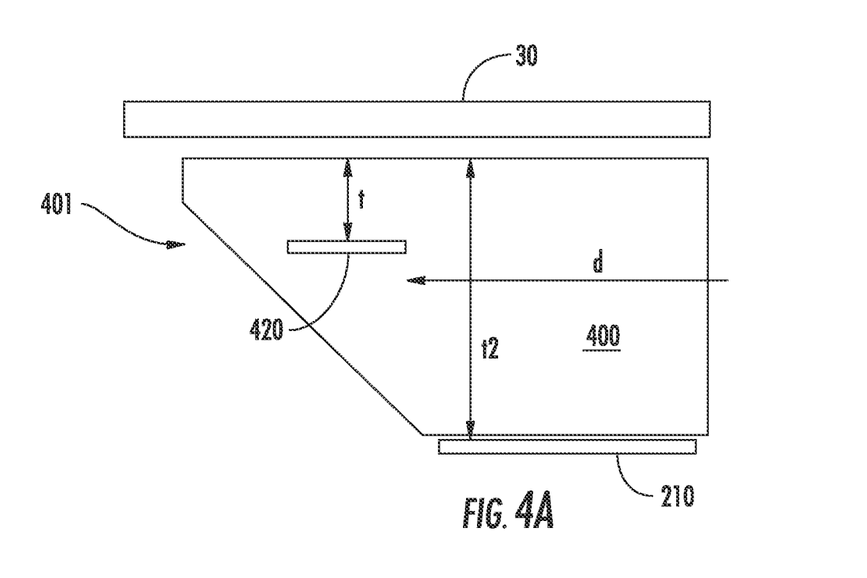
FIGS. 4A-4B are side views of platens with an embedded edge heater according to another embodiment.
Figure 4B:
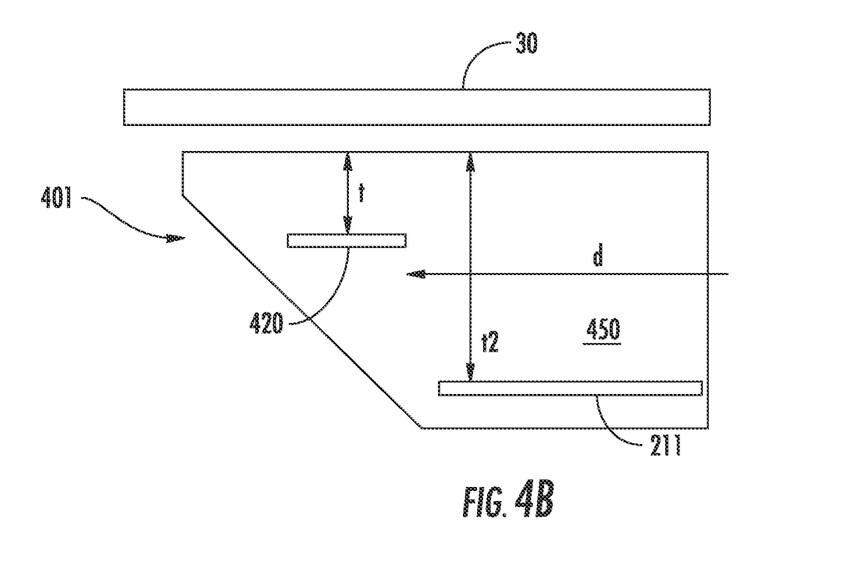

FIGS. 4A-4B show another embodiment. In this embodiment, unlike the previous embodiments, the edge heater 420 is embedded in the platen 400, rather than being affixed to the platen 400. In FIG. 4A, like the embodiments of FIGS. 2A and 3A, the primary heating element 210 may be disposed on the bottom surface of the platen 400. The platen 400 may have a thickness "t2", which may be about 8 mm. As above, the platen 400 may have sidewalls 401 that are tapered.

In the embodiment of FIG. 4A, the edge heater 420 is embedded in the platen 400. This may be achieved by manufacturing the platen 400 from two horizontal portions. For example, the platen 400 may comprise a ceramic material. The edge heater 420 may then be placed between the two horizontal ceramic portions. The assembly may then be fired, encapsulating the edge heater 420 in the platen 400. The edge heater 420 may be a flat ring, similar to that shown in FIG. 3A. The electrical connections to the edge heater 420 may pass through the platen 400 to the environment, where they are connected to the controller 40. Like the embodiment of FIG. 3A, the edge heater 420 may be disposed a distance "t" below the top surface of the platen 400, where that distance "t" may be about 1-7 mm. Additionally, the distance "d" may be the inner diameter of the edge heater 420 and may be about 280 mm, while the diameter of the platen 400 may be about 294 mm. The edge heater 420 may have a width of about 1-4 mm.

FIG. 4B shows a variation of the embodiment of FIG. 4A where the primary heating element 211 is also embedded in the platen 450. The distance from the primary heating element 211 to the top surface of the platen 450, labeled "t2" may be 2-8 mm, while the distance from the edge heater 420 to the top surface of the platen 450, labeled "t", may be 1-7 mm.

The manufacturing of the platen 450 of FIG. 4B may be more complex than the previous embodiments. The platen may be made up of three horizontal portions; a top portion, a middle portion and a bottom portion. The edge heater 420 is disposed between the top portion and the middle portion, while the primary heating element 211 is disposed between the middle portion and the bottom portion. The entire assembly, which includes the three ceramic portions with the primary heating element 211 and edge heater 420 disposed therebetween, may then be fired, encapsulating the primary heating element 211 and the edge heater 420 in the platen 450.

FIGS. 3A-3B and 4A-4B show the use of an edge heater that is in a different horizontal plane than the primary heating element 210. Specifically, the primary heating element, the edge heater and the top surface of the platen may all form parallel planes. The distance between the plane in which the edge heater is disposed and the top surface may be less than the distance between the plane in which the primary heating element is disposed and the top surface. In other words, the edge heater in these embodiments may be disposed closer to the top surface of the platen than the primary heating element. By disposing the edge heater closer to the top surface, the edge heater may better regulate the temperature of the platen along the outer edge. The configuration described here where the edge heater and the primary heating element are disposed in different planes can be achieved to several ways. For example, the primary heating element 210 may be disposed on the bottom surface of the platen (See FIGS. 3A and 4A) or the primary heating element 211 may be disposed within the platen (see FIGS. 3B and 4B). The edge heater 320 may be disposed on an exterior surface of the platen, such as on a horizontal annular ring portion 304 (See FIGS. 3A and 3B), or may be disposed within the platen (see FIGS. 4A and 4B).

While FIGS. 3A-3B and 4A-4B show a single edge heater that is ring shaped, other embodiments are possible. For example, a plurality of edge heaters may be utilized. In certain embodiments, the edge heater closest to the outer circumference of the platen may be the closest to the top surface, with each successive edge heater being disposed further from that top surface.

Figure 5:
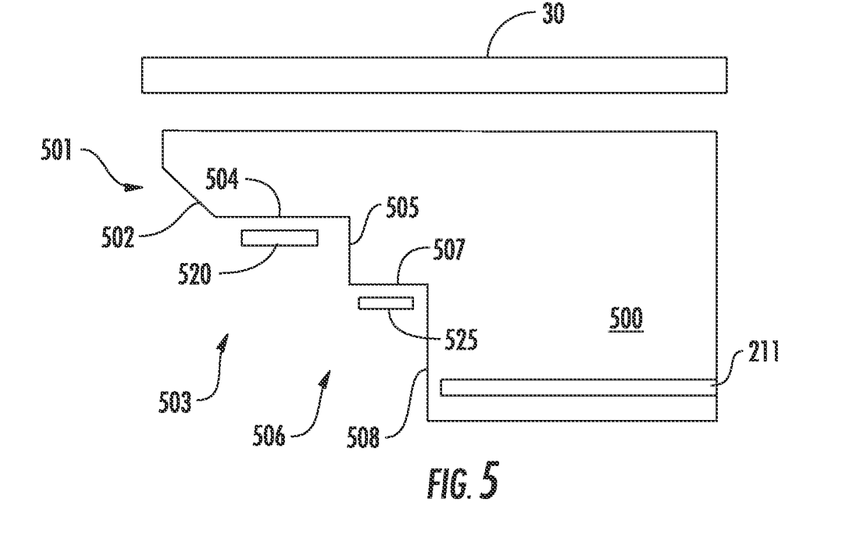
FIG. 5 is a side view of a platen having multiple edge heaters according to another embodiment.

FIG. 5 shows a variation of the embodiment of FIG. 3B, which includes a primary heating element 211 disposed within the platen 500. In this embodiment, the platen 500 has a plurality of notches, each of which creates a horizontal annular ring portion. The sidewall 501 of the platen 500 may have a tapered portion 502. The sidewall 501 may have a first notch 503, which creates a first horizontal annular ring portion 504 and a first vertical wall 505. Further, the sidewall 501 may have a second notch 506, which creates a second horizontal annular ring portion 507 and a second vertical wall 508. The second vertical wall 508 extends between the second horizontal annular ring portion 507 and the bottom surface of the platen 500. Of course, additional notches, which create additional horizontal annular ring portions, may also be included. Disposed on the first horizontal annular ring portion 504 may be a first edge heater 520. Disposed on the second horizontal annular ring portion 507 may be a second edge heater 525. As noted above, the first horizontal annular ring portion 504, which is closer to the outer edge of the platen 500 is disposed closer to the top surface than the second horizontal annular ring portion 507, which is disposed further from the outer edge of the platen 500. If additional horizontal annular ring portions were present, each would be slightly further from the top surface than its adjacent neighbor. For example, first horizontal annular ring portion 504 may be disposed 1-2 mm below the top surface, while second horizontal annular ring portion 507 may be disposed 3-4 mm below the top surface of the platen 500. Each edge heater 520, 525 may be between 3-10 mm wide.

Further, although not shown, a similar variation of FIG. 3A, which has multiple notches and the primary heating element 210 disposed on the bottom surface of the platen 500 may also be employed. As described above, this embodiment may have two or more horizontal annular ring portions, where an edge heater is disposed on each of these horizontal annular ring portions.

Figure 6:
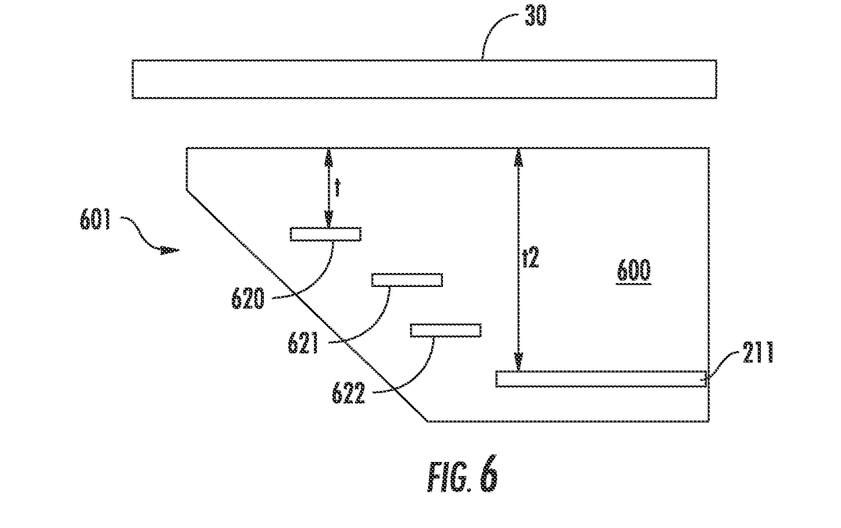
FIG. 6 is a side view of a platen having multiple embedded edge heaters according to another embodiment.

FIG. 6 shows a variation of FIG. 4B, which has multiple embedded edge heaters. In this embodiment, edge heaters 620, 621, 622 are all embedded in the platen 600. As described above, the edge heater 620 that is disposed closest to the outer edge of the platen 600 may be disposed closest to the top surface of the platen. As the edge heaters get further from the outer edge, the distance between that edge heater and the top surface increases, as shown in FIG. 6, where edge heater 620 is disposed closest to the top surface of the platen 600, and edge heater 622, which is the furthest from the outer edge, is disposed furthest from the top surface of the platen 600. For example, edge heater 620 may be 1-2 mm away from the top surface, while edge heater 622 may be 5-6 mm away from the top surface of the platen 600. Additionally, the primary heating element 211 may also be disposed in the platen 600. This platen 600 may be manufactured in the manner described in the embodiment of FIG. 4B, where the platen 600 has a greater number of horizontal portions. Although three edge heaters 620, 621, 622 are shown, any number of edge heaters may be embedded in the platen 600.

Further, a variation of FIG. 4A, which has multiple embedded edge heaters and where the primary heating element 210 is disposed on the bottom surface of the platen may be used as well.

Figure 7:
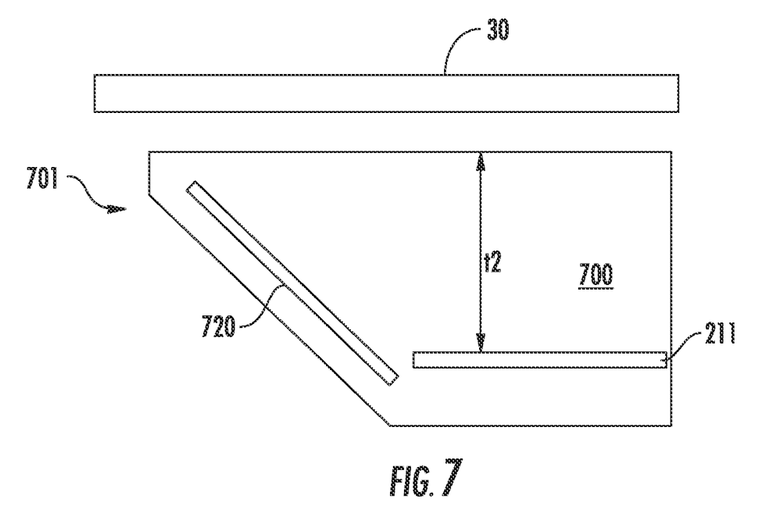
FIG. 7 is a side view of a platen having a embedded edge heater disposed along the tapered sidewall.

FIG. 7 shows another embodiment, which is similar to that shown in FIG. 2B. In this embodiment, the edge heater 720 is disposed at an angle, which may be parallel to the tapered sidewall 701. Thus, like the embodiments shown in FIG. 2A-2B, the edge heater 720 may be frustoconical in shape. However, unlike the embodiment of FIG. 2B, the edge heater 720 is embedded in the platen 700. In this embodiment, the primary heating element 211 is disposed in the platen 700. However, in another embodiment, the primary heating element may be affixed to the bottom surface of the platen 700, as shown in FIG. 2A. To manufacture this configuration, three or more pieces of ceramic may be used. The heater materials are sandwiched between those ceramic pieces. A co-fire process then follows which will result in a single platen with embedded heating elements.

Further, in certain embodiments, additional heating elements may be used to bridge between the edge heater and the primary heating element 210 to reduce thermal stresses in the platen.

Figure 8:
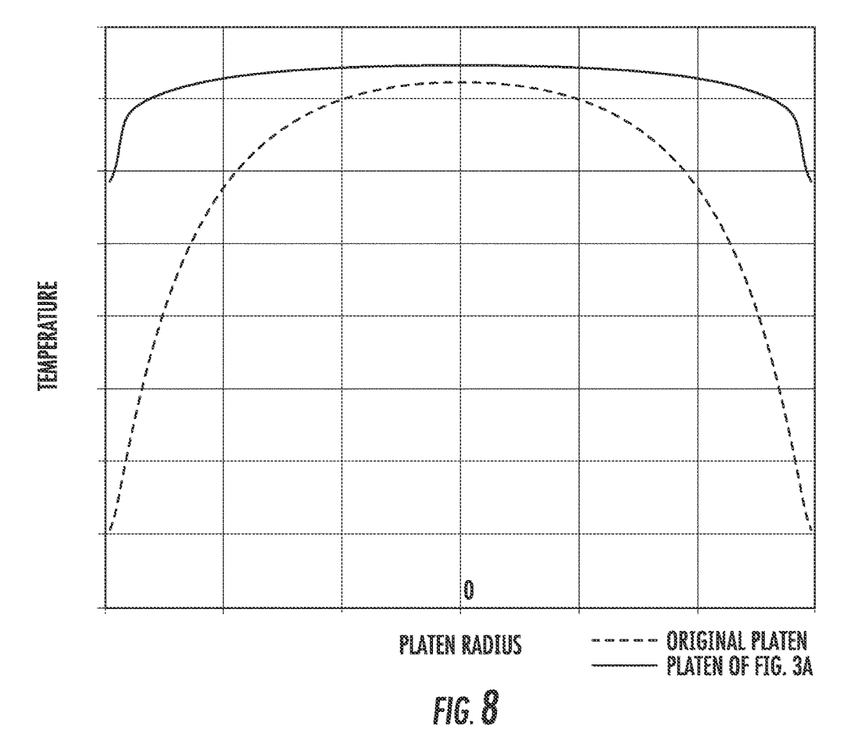
FIG. 8 shows a comparison of the temperature of the platen as a function of temperature with and without an edge heater.

FIG. 8 shows the improvement in temperature uniformity that may be achieved using the present system. Specifically, this figure shows the temperature profile of a traditional platen as compared to the system shown in FIG. 3A. As can be seen, the temperature roll-off at the outer edge is greatly reduced by the system of FIG. 3A. For example, the temperature gradient of a traditional platen may be as much as 8%. The system of FIG. 3A exhibited a temperature gradient of less than 2%.

The embodiments described above in the present application may have many advantages. For example, by introducing an edge heater, the temperature uniformity throughout the entirety of the platen may be improved. This improved temperature uniformity may reduce thermal stress within the platen, extending its life and reducing failures. Further, improved temperature uniformity may have a positive impact of semiconductor device yield, as the workpiece 30 may be more consistently heated. Further, the use of a separate edge heater allows independent current control of the outer edge of the platen. Thus, the amount of current used to heat the main portion of the platen does not affect the amount of current that may be used to heat the outer edge. This may also allow more uniform heating of the workpiece 30.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece holding and heating apparatus, comprising:
    a platen, wherein the platen comprises a top surface, a bottom surface, and a sidewall extending between the top surface and the bottom surface;
    a primary heating element disposed in a first plane and disposed within or affixed to the platen; and
    an edge heater embedded in the platen and disposed in a second plane, where the second plane is closer to the top surface than the first plane.

2. The workpiece holding and heating apparatus of claim 1, wherein the first plane, the second plane and the top surface are parallel to one another.

3. The workpiece holding and heating apparatus of claim 1, wherein the primary heating element is affixed to the bottom surface of the platen.

4. The workpiece holding and heating apparatus of claim 1, wherein the primary heating element is embedded in the platen.

5. The workpiece holding and heating apparatus of claim 1, further comprising a second edge heater, disposed in a third plane, different than the first plane and the second plane, wherein the top surface, the first plane, the second plane and the third plane are all parallel.

6. The workpiece holding and heating apparatus of claim 1, wherein the primary heating element and the edge heater are independently controlled.

7. The workpiece holding and heating apparatus of claim 1, wherein the edge heater is formed as an annular ring having an outer diameter and wherein the platen comprises a tapered sidewall, such that the bottom surface of the platen has a first diameter, smaller than a second diameter of the top surface, and wherein the outer diameter of the edge heater is greater than the first diameter.

8. The workpiece holding and heating apparatus of claim 1, wherein the platen comprises a ceramic material.

9. A workpiece holding and heating apparatus, comprising:
    a platen, wherein the platen comprises a top surface, a bottom surface, and a sidewall extending between the top surface and the bottom surface, where the sidewall comprises a horizontal annular ring portion, parallel to the top surface, and a tapered portion forming an acute angle with the top surface and extending downward from the top surface to the horizontal annular ring portion;
    a primary heating element; and
    an edge heater disposed on the horizontal annular ring portion.

10. The workpiece holding and heating apparatus of claim 9, wherein the edge heater is ring shaped.

11. The workpiece holding and heating apparatus of claim 9, where the sidewall further comprises a second horizontal annular ring portion, parallel to the top surface, wherein the second horizontal annular ring portion is disposed farther from the top surface than the horizontal annular ring portion, and further comprising a second edge heater disposed on said second horizontal annular ring portion.

12. The workpiece holding and heating apparatus of claim 9, wherein the sidewall further comprises a vertical portion extending between the horizontal annular ring portion and the bottom surface.

13. The workpiece holding and heating apparatus of claim 9, wherein the edge heater comprises a thin film.

14. The workpiece holding and heating apparatus of claim 9, wherein the platen comprises a ceramic material.

15. A workpiece holding and heating apparatus, comprising:
- a platen, wherein the platen comprises a top surface, a bottom surface, and a tapered sidewall extending between the top surface and the bottom surface;
- a primary heating element; and
- an edge heater disposed within or affixed to the platen and parallel to the tapered sidewall.

16. The workpiece holding and heating apparatus of claim 15, wherein the edge heater is disposed on the tapered sidewall.

17. The workpiece holding and heating apparatus of claim 15, wherein the edge heater is embedded in the platen.

18. The workpiece holding and heating apparatus of claim 15, where the edge heater is frustoconical in shape.

19. The workpiece holding and heating apparatus of claim 15, wherein the edge heater comprises a thin film.

20. The workpiece holding and heating apparatus of claim 15, wherein the platen comprises a ceramic material.

\* \* \* \* \*